United States Patent [19]
Rogoff et al.

[11] Patent Number: 5,528,136
[45] Date of Patent: Jun. 18, 1996

[54] VLSI COMPONENT TESTER WITH AVERAGE CURRENT MEASURING CAPABILITY

[75] Inventors: David H. Rogoff, West Hills; Edward A. Ostertag, Simi Valley, both of Calif.

[73] Assignee: Teradyne, Inc., Boston, Mass.

[21] Appl. No.: 319,208

[22] Filed: Oct. 6, 1994

[51] Int. Cl.6 .......................... G01R 23/16; G01R 31/28; H03L 1/00; H03K 4/00
[52] U.S. Cl. ...................... 324/158.1; 364/487; 327/141; 327/334; 326/16
[58] Field of Search ................... 324/76.15, 73, 324/73 PR, 158.1, 73 R, 73 AT; 371/27, 20, 16; 327/141, 100, 106; 307/269, 356; 328/14, 187; 373/102, 104; 364/487

[56] References Cited

U.S. PATENT DOCUMENTS

| | | |
|---|---|---|
| 4,641,246 | 2/1987 | Halbert et al. .................. 324/76.15 |
| 4,694,242 | 9/1987 | Peterson et al. ................. 324/73 R |
| 4,806,852 | 2/1989 | Swan et al. ..................... 324/73 R |
| 5,115,447 | 5/1992 | Bowman .......................... 373/102 |
| 5,381,045 | 1/1995 | Kojima .......................... 327/141 |

Primary Examiner—Kenneth A. Wieder
Assistant Examiner—Barry C. Bowser
Attorney, Agent, or Firm—Edmund J. Walsh

[57] ABSTRACT

Automatic test equipment including a circuit to measure average current consumed by a device under test. The circuit operates during the execution of a test pattern which is not dedicated to measuring average current. The average current measuring circuit sets the measurement interval to account for a lag between the current drawn by the device under test and the current being measured.

23 Claims, 4 Drawing Sheets

VLSI COMPONENT TESTER WITH AVERAGE CURRENT MEASURING CAPABILITY

This invention relates generally to automatic test equipment and more specifically to automatic test equipment for testing VLSI components.

VLSI components, such as microprocessors and memory chips, are usually tested by their manufacturers at various stages in the manufacturing process. Automatic test equipment (generally "testers") are programmed to apply various types of signals to a device under test ("DUT") and measure various responses. Testers are used to test individual devices by comparing measured values of certain parameters to specified values or to the values which properly functioning parts should exhibit. Testers are also used by engineers developing the VLSI components to determine the values of certain parameters which good parts exhibit.

One measurement which is sometimes made is the average current which a VLSI component uses while in operation. A high average current, might for example, indicate a defect in a VLSI component. During development, an engineer might want to know the average current used by a VLSI device as this parameter is needed by users of the component. This parameter is particularly important for CMOS parts which are often run by batteries in low power applications. Since the average current dictates the power dissipation of the part, knowing the average current aids in sizing heat sinks or cooling fans for electronic equipment.

The average current, referred to as $I_{dda}$, has traditionally been measured by programming the tester to repeatedly execute a test program while measuring, at random intervals, the current flowing into the part. CMOS components are used for low power applications because each CMOS circuit normally draws very little current. However, CMOS circuits draw current whenever they change states. These state changes occur when the part is clocked by a periodic clock. As a result, the instantaneous current flow into a CMOS component is a series of current spikes which periodically occur at the clock frequency. To compute an accurate measurement, it is necessary to take enough samples of the instantaneous current to average out the current spikes.

Such an approach has several drawbacks. First, it requires the user of the tester to write a test program which executes while this measurement is being made. Such a program is often a series of commands which is repeated numerous times in a loop. However, high speed testers are not easily designed to execute loops of arbitrary lengths. As a result, either great care must be exercised in designing the test program so that it is of a size the tester can execute repeatedly in a loop or expensive hardware must be incorporated into the tester to allow it to execute arbitrary length programs in a loop.

Second, it increases test time of each component. As testers are very expensive, manufacturers of VLSI components want to be able to test as many components as possible with one tester. Requiring that a separate test be run to measure the average current of a part reduces the number of components a tester can test.

A second type of current measurement which is sometimes made is the current drawn by a component while it is not in operation. This type of current is called quiescent current or $I_{ddq}$. Since this is a static current, it is much simpler to measure. While errant values of $I_{ddq}$ can reveal defects in a component, it does not give the same information as measuring the average current drawn by the component while in use. Accordingly, there is still a need for improvements in the measurement of average current.

SUMMARY OF THE INVENTION

With the foregoing background in mind, it is an object of the invention to provide a tester which can accurately measure average current consumed by a DUT.

It is also an object to provide a tester which can measure average current consumed by a device while executing a test pattern making other measurements.

The foregoing and other objects are achieved in a tester having a current measuring circuit connected to a voltage source which supplies voltage to a DUT. The value of the measured current is periodically sampled and the running total of the measured values are stored in an accumulator. In a preferred embodiment, the accumulator is controlled to store values after some initialization interval at the start of a test pattern and stops storing values after some stretch interval at the end of the pattern. A timer measures the actual amount of time during which values are stored in the accumulator, which allows calculation of the average current. In a preferred embodiment, the integration interval is set to adjust for the effects of voltage source dynamic response and resistive and capacative elements in the path between the voltage source and the DUT.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
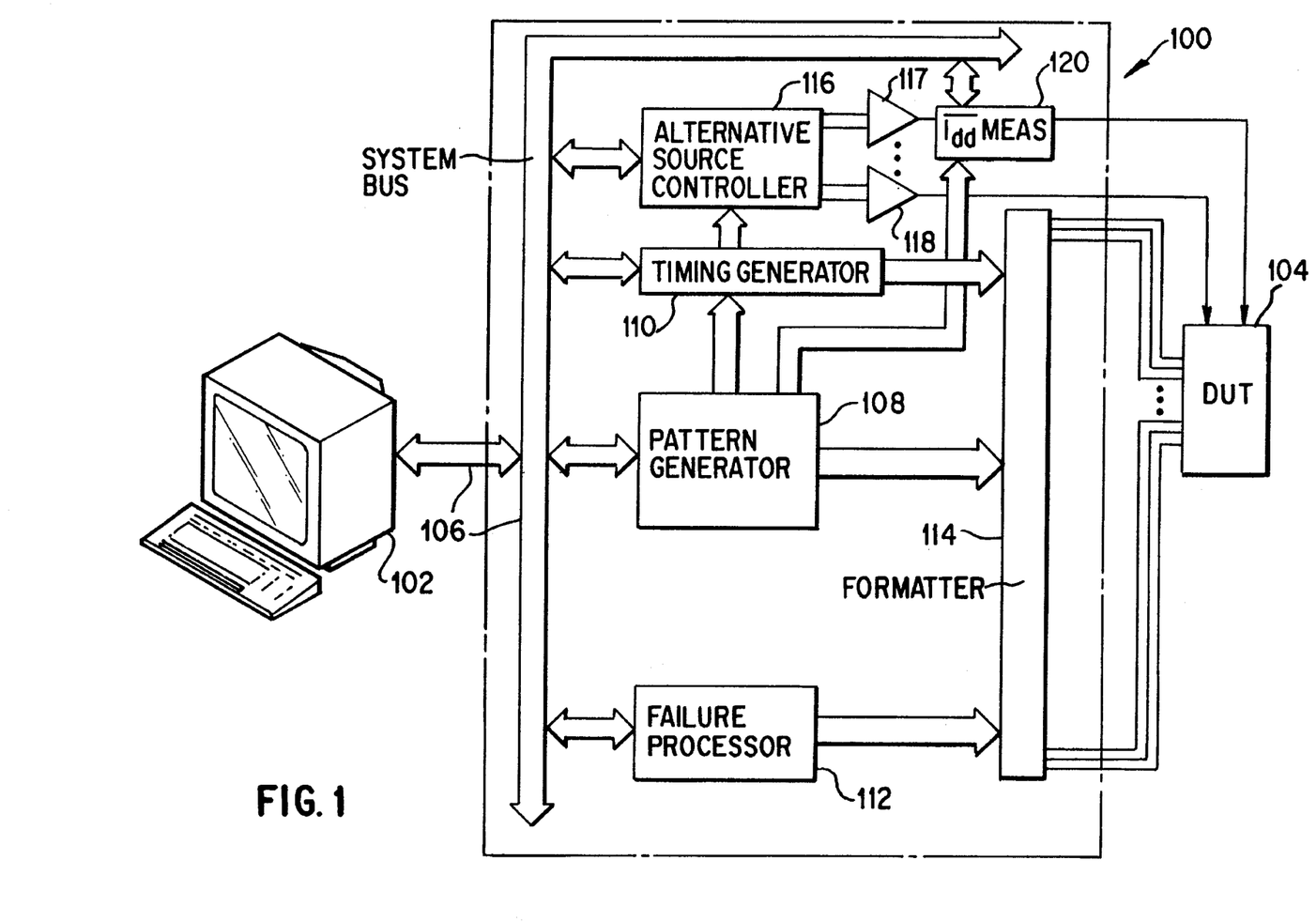
FIG. 1 is a block diagram of a tester incorporating the invention.

FIG. 1 shows a block diagram of a tester 100 incorporating the invention. Typically, tester 100 is connected to and controlled by a computer work station 102. A user develops test patterns on work station 102 and loads them into tester 100 over system bus 106. In addition, tester 100 reports results of tests to work station 102 over system bus 106 for display in a format convenient to a human test engineer or component developer. In addition, a user may enter commands at work station 102 which will start a test or otherwise provide operating parameters to a test.

Tester 100 is connected to a device under test (DUT) 104. DUT 104 could be any electrical component or assembly. However, for the preferred embodiment described herein, it is assumed that DUT 104 is a CMOS VLSI component such as a microprocessor. Tester 100 makes numerous connections to DUT 104. Each connection is referred to as a "channel" or a "pin". Tester 100 generates test signals independently for each channel which are applied as inputs to DUT 104. Some channels receive signals which are outputs from DUT 104 for the purpose of determining whether DUT 104 is operating correctly. The test signals generated and the expected responses from DUT 104 are all specified by the test program, or "pattern" executed by tester 100.

The circuitry shown for tester 100 is normally enclosed in one or more electronics cabinets and a test head (not shown). These are called the "tester body." Between the tester body and the DUT, interface hardware is usually employed. This interface hardware-could include such things as a device interface board and a probe card. As the circuitry of the invention is mounted in the tester body, the interface hardware is not shown.

To execute a pattern, the pattern is loaded into memory within pattern generator 108 of tester 100. The pattern is made up of a series of vectors. Each vector contains information about signals to be applied or expected to be received on each channel of the tester during one cycle of the tester operation.

For each vector, pattern generator 108 sends information to formatter 114 about each channel. The information about each channel indicates whether the channel should be configured to drive or to receive a signal to DUT 104. The value of that signal is also specified.

Further, pattern generator 108 sends information to timing generator 110. For complicated components, not all signals should be applied to or read from a DUT exactly at the beginning of a cycle of tester 100. Various operations should occur at various times in relation to the start of a cycle. Timing generator 110 provides control signals to formatter 114 which control when signals in various channels are read or written. The information provided to timing generator 110 by pattern generator 108 in turn dictate the values of these control signals.

Formatter 114 receives the information from pattern generator 108 and timing generator 110. At the appropriate time, formatter 114 produces an output signal on each channel having the specified value or reads a signal from DUT 104 and compares it to the programmed expected value.

When the programmed expected value does not match the actual value, formatter 114 provides an indication of the error to failure processor 112. Failure processor 112 then stores various information about the signals being applied to and read from DUT 104. The type of information stored is controlled by information a user has entered at workstation 102.

The signals specified by pattern generator 108 represent digital signals. In addition, to test a component, it might be necessary to apply other types of signals. For example, it is generally necessary that a power signal be applied to a DUT to enable it to operate properly. Accordingly, tester 100 includes voltage sources 117 and 118. Alternative source controller 116 controls the voltage level of sources 117 and 118. It should be appreciated that only two alternative sources are shown. However, any number and any type of sources might be included.

System bus 106, pattern generator 108, timing generator 110, failure processor 112, formatter 114 alternative source controller 116 and voltage sources 117 and 118 represent components which are conventionally included in a tester. Accordingly, they are of known construction. The specific implementation of the known components is not critical to the invention. Also, the architecture of the portions of the tester used to generate test signals applied to the DUT is not critical Tester 100 includes average Idd measurement circuit 120, which is described in greater detail in FIG. 2. Suffice it to say here that average Idd measurement circuit 120 is connected to voltage source 117, which is the voltage source used to provide power to DUT 104. Where multiple voltage sources are present, average $I_{dd}$ measurement circuit 120 could be multiplexed so that it is connected to the voltage source providing power to DUT 104. Alternatively, multiple copies of average Idd measurement circuit 120 could be included in tester 100.

Average Idd measurement circuit 120 receives commands from work station 102 which indicate when it is to operate. The measurements made by average $I_{dd}$ measurement circuit 120 are provided back to work station 102 over system bus 106. Work station 102 includes a general purpose digital computer, which is programmed to perform numerical calculations on the measured values. The results of these calculations are displayed in a format convenient for viewing by a human.

To make an average measurement, it is necessary that average $I_{dd}$ measurement circuit 120 measure values over some time interval during which DUT 104 is operational. Accordingly, average $I_{dd}$ measurement circuit 120 makes its measurement while tester 100 is executing a pattern. Commands from work station 102 specify how long after the start of the test pattern and how long after the end of the test pattern average $I_{dd}$ measurement circuit should collect values for use in computing the average value of $I_{dd}$. Also, average $I_{dd}$ measurement circuit 120 is connected to pattern generator 108, which provides an indication of the beginning and the end of a pattern.

Figure 2:
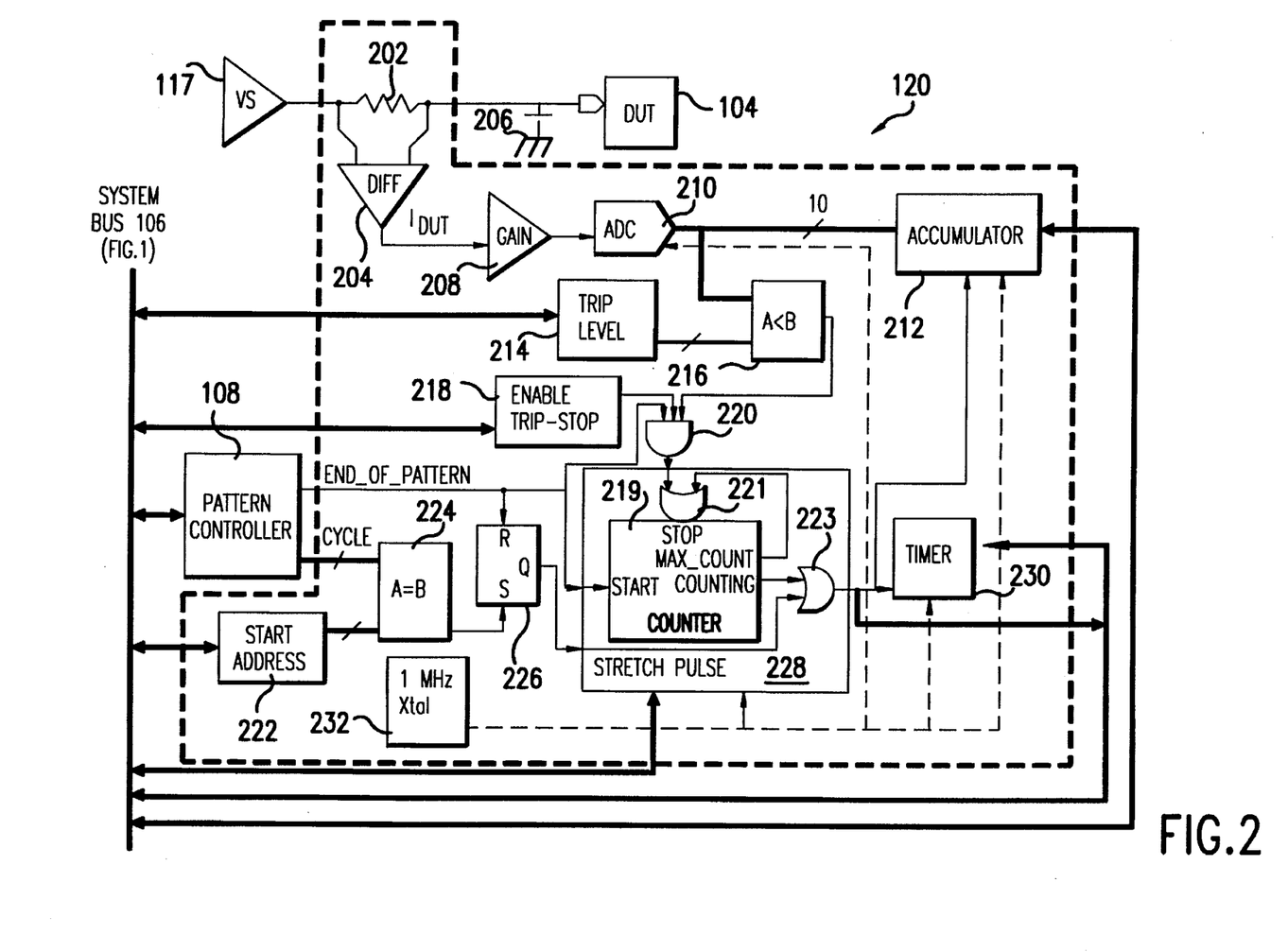
FIG. 2 is a simplified schematic diagram of the current measuring circuit of FIG. 1.

Turning now to FIG. 2, average $I_{dd}$ measurement circuit 120 is shown in greater detail. The connection between voltage source 117 and DUT 104 is made through current sense resistor 202. Current sense resistor is a precision resistor with a relatively low value. A value between 0.1 and 1000 Ω is preferable, depending on the range of current to be measured. More preferably, several resistors of different values are connected to voltage source 117 through switches and resistor 202 is selected by closing one switch. In this way, the most appropriate value of resistor 202 may be selected. The voltage drop across resistor 202 is proportional to current supplied to DUT 104.

Differential amplifier 204 measures the voltage drop across resistor 202. The output of differential amplifier 204 is provided to amplifier 208, where the signal is amplified. The gain of amplifier 208 is not critical to the invention. The gain is selected to boost the signal to a level which can be conveniently processed.

The output of amplifier 208 is provided to analog to digital converter 210. Here a 10 bit analog to digital converter is used. However, the number of bits is not critical to the invention. Analog to digital converter 210 produces an output digital value at a periodic rate. To assist in periodic conversions, analog to digital converter 210 includes a sample and hold circuit as is conventional in the art. In the preferred embodiment, that rate is 1 MHz. Tester 100 (FIG. 1) executes vectors at a much faster rate, possibly at 100 MHz or 200 MHz. However, we have found that producing digital values for average $I_{dd}$ measurement does not have to be done at such a high rate. As will be observed in conjunction with FIG. 4, the current out of voltage source 117 is slowly varying and therefore does not to be sampled at a high rate.

The values produced by analog to digital converter 210 are totaled in digital accumulator 212. Digital accumulator 212 is reset at the start of each measurement of average $I_{dd}$ and continues to add the values from analog to digital converter 210 as long as the output of stretch pulse circuit 228 is in a logic HI state.

The output of stretch pulse circuit 228 also enables timer 230. Timer 230 is a counter which counts pulses of 1 MHz crystal oscillator 232. The exact frequency of crystal oscillator 232 is not important to the invention. However, it should be at the same clock rate as outputs of analog to digital converter 210 are added to the contents of accumulator 212. Timer 230, like accumulator 212 is reset to zero at the start of a measurement. Therefore, at the end of a measurement interval, accumulator 212 holds the sum of all measurements of current flowing to DUT 104 taken during that interval and timer 230 holds a count of the total number of measurements taken. These values are provided to work station 102 (FIG. 1) over system bus 106. These values may be used to compute the average current value over the measurement interval.

As described above, when the output of stretch pulse circuit 228 is a logic HI, both accumulator 212 and timer 230 are enabled. The output of stretch pulse circuit is initialized to a logic LO. It first goes HI when the output of flip-flop 226 goes high.

The set input of flip-flop 226 is connected to the output of comparator 224. Comparator 224 has one input connected to the cycle output of pattern generator 108. The cycle output specifies the address of the vector in a test pattern which is currently being executed. This signal is normally generated by conventional pattern controllers. The second input to comparator 224 is connected to a register holding a start address which is specified by the user through work station 102 (FIG. 1). Register 222 is loaded over system bus 106. The output of comparator 224 and the output of flip-flop 226 both go HI when pattern generator 108 executes a vector at a specified start address. Likewise, the output of stretch pulse circuit 228 goes HI when the vector at the start address is executed. Thus, execution of the vector at the specified start address initiates the gathering of data in accumulator 212 and timer 230.

The output of flip-flop 226 is reset to LO when pattern generator 108 outputs an End_Of_Pattern signal, indicating that it has completed execution of a test pattern. An End_Of_Pattern signal is normally generated by conventional pattern controllers. With the output of flip-flop 226 LO, the output of stretch pulse circuit 228 will be reset when the output of AND gate 220 is HI or when counter 219 reaches its final count, whichever happens first.

Stretch pulse circuit 228 contains counter 219, OR gate 221 and OR gate 223. Before a test, counter 219 is preset by work station 102 over system bus 106. The value in counter 219 specifies a maximum "stretch time." The stretch time is the amount of time after the end of a pattern which average $I_{dd}$ measurement circuit 120 continues to accumulate current measurements.

When pattern controller 108 generates the End_Of_Pattern signal, counter 219 begins to count at the rate dictated by crystal 232. The output of stretch pulse circuit 228 is provided by OR gate 223. It is the logical OR of the outputs of flip-flop 226 and the Counting output of counter 219. The Counting output of counter 219 is HI when counter 219 is counting. Therefore, this output of stretch pulse circuit 228 is logical HI for the duration of the test pattern plus the stretch time. This output controls accumulator 212 and timer 230 as well as passing over system bus 106 so that work station 102 can determine that the measurement has finished.

Counter 219 has a count enable input connected to the output of OR gate 221. Counter 219 stops counting when the output of OR gate 221 is a logical HI. One input of OR gate 221 is connected to the max_count output of counter 219. The max_count output of counter 219 goes HI when counter 219 has counted to the max_count. Thus, counter 219 does not count beyond the max_count.

The second input of OR gate 221 is provided by AND gate 220. The output of AND gate 220 is a logical HI only when its three inputs are HI. The inputs of AND gate 220 are derived from the End_Of_Pattern signal, the output of Enable Trip-stop register 218 and the output of comparator 216.

Register 218 is loaded over system bus 106 from work station 102 (FIG. 1) based on user provided inputs. When the Enable_Trip_Stop register stores a logic HI, the output of AND gate 220 will be a logic HI when the output of comparator 216 is HI and the End_Of_Pattern signal is HI. As can be seen in FIG. 2, the output of comparator 216 goes HI when the output of ADC 210 drops below the Trip_Level value stored in register 214. The value in Trip_Level register 214 is loaded over system bus 106 from work station 102 (FIG. 1) based on information specified by a user. Therefore, the Stop input to counter 219 is set HI either when counter 219 reaches its max_count value or when the output of ADC 210 is less than the Trip_Level and the Enable_Trip_Stop register 218 has been loaded with a logic HI and the pattern has ended.

To summarize the operation of stretch pulse circuit 228, a user specifies a vector in a test pattern at which to begin taking measurements for the average value of $I_{dd}$ by storing a value in Start_Address register 222. The measurements continue until some time after the end of the pattern. The user may specify whether the measurements end a programmed amount of time after the end of the test pattern or end when the average value drops below a programmed value. The motivation for such a circuit might be understood from FIG. 3.

Figure 3:
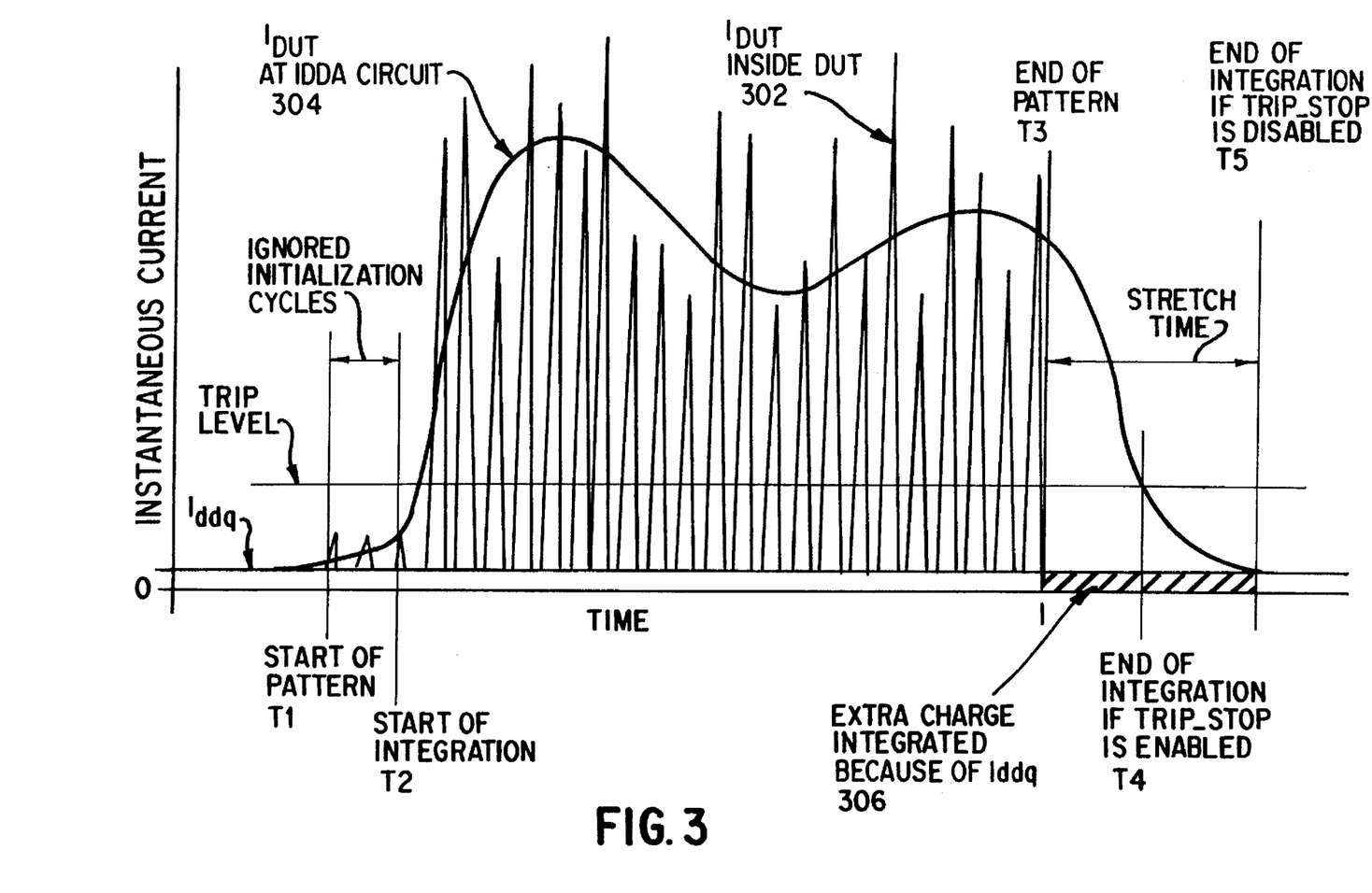
FIG. 3 is a flow chart showing the operation of software running on the tester of FIG. 1.

FIG. 3 is a graph showing instantaneous current as a function of time. Trace 302 depicts the instantaneous current flowing into DUT 104 (FIG. 2). Trace 304 depicts the instantaneous current flowing through sense resistor 202 (FIG. 2). FIG. 3 shows that the current into DUT 104 contains numerous spikes. Each spike reflects a transition within DUT which draws current. These spikes occur each time DUT 104 is clocked.

Trace 304 is a much smoother curve. It reflects that reactive elements are connected to DUT 104. In FIG. 2, these reactive elements are depicted as capacitor 206. The difference is due to the fact that the current is being measured inside the body of the tester rather than at the input to the DUT.

FIG. 3 shows that a test pattern begins at time T1. Both traces 302 and 304 begin at a current value of $I_{ddq}$ at time T1. $I_{ddq}$ represents the quiescent current of DUT 104, i.e. the current which DUT 104 draws when it is not undergoing a state transition.

The first few cycles of a pattern may initialize DUT 104. Accordingly, the current drawn during those first few initialization cycles might not be representative of the current drawn by DUT 104 while in operation. Accordingly, it might be desirable to program average Idd measuring circuit 120 (FIG. 2) to defer making measurements until some time T2 after the start of the test pattern. As described above, the start of measurements is deferred by loading a value in start address register 222 (FIG. 2).

Following time T2, the peak values of trace 302 increase as does the value of trace 304. However, the increase in trace 304 lags due to the presence of capacitance 206. At some time T3, the test pattern ends. Trace 302 returns to its quiescent value $I_{ddq}$. Again, because of the presence of reactive components, trace 304 lags in returning to $I_{ddq}$.

As trace 304 represents the current which is being measured, and it lags behind the current actually being drawn by DUT 104, it is necessary to stretch out the measurement interval past the end of the test pattern. At the user's option, the measurement may be extended to T4 when trace 304 falls below some trip level. Alternatively, also at the user's option, the measurement may be extended until time T5 which occurs a programmed amount of time after the end of the pattern at time T3.

The method of terminating the measurement is specified by the user based on the type of device being tested and the amount of capacitance coupled to DUT 104. If the amount of time required for trace 304 to fall to its quiescent value is known, that value may be programmed into timer 219 (FIG. 2) and the Enable_Trip_Stop set to a LO. Conversely, if the time is not known, Enable_Trip_Stop may be set to HI and a trip level programmed into register 214 (FIG. 2) which approximates the quiescent current of DUT 104 or some other suitable value.

In extending the measurement interval beyond the end of the pattern, the measurement is in essence capturing the current at the end of the pattern that it did not see at the beginning of the pattern because the measured current lags behind the current actually used. However, during both the interval at the beginning of the pattern and the interval at the end of the pattern, quiescent current was flowing into DUT 104. Thus, the quiescent current does not lag and is, in essence, being counted twice. Block 306 represents the amount added to the value in accumulator 212 during the stretch time following the end of the pattern. To make a more accurate measurement, this value can be subtracted from the contents of accumulator 212.

Figure 4:
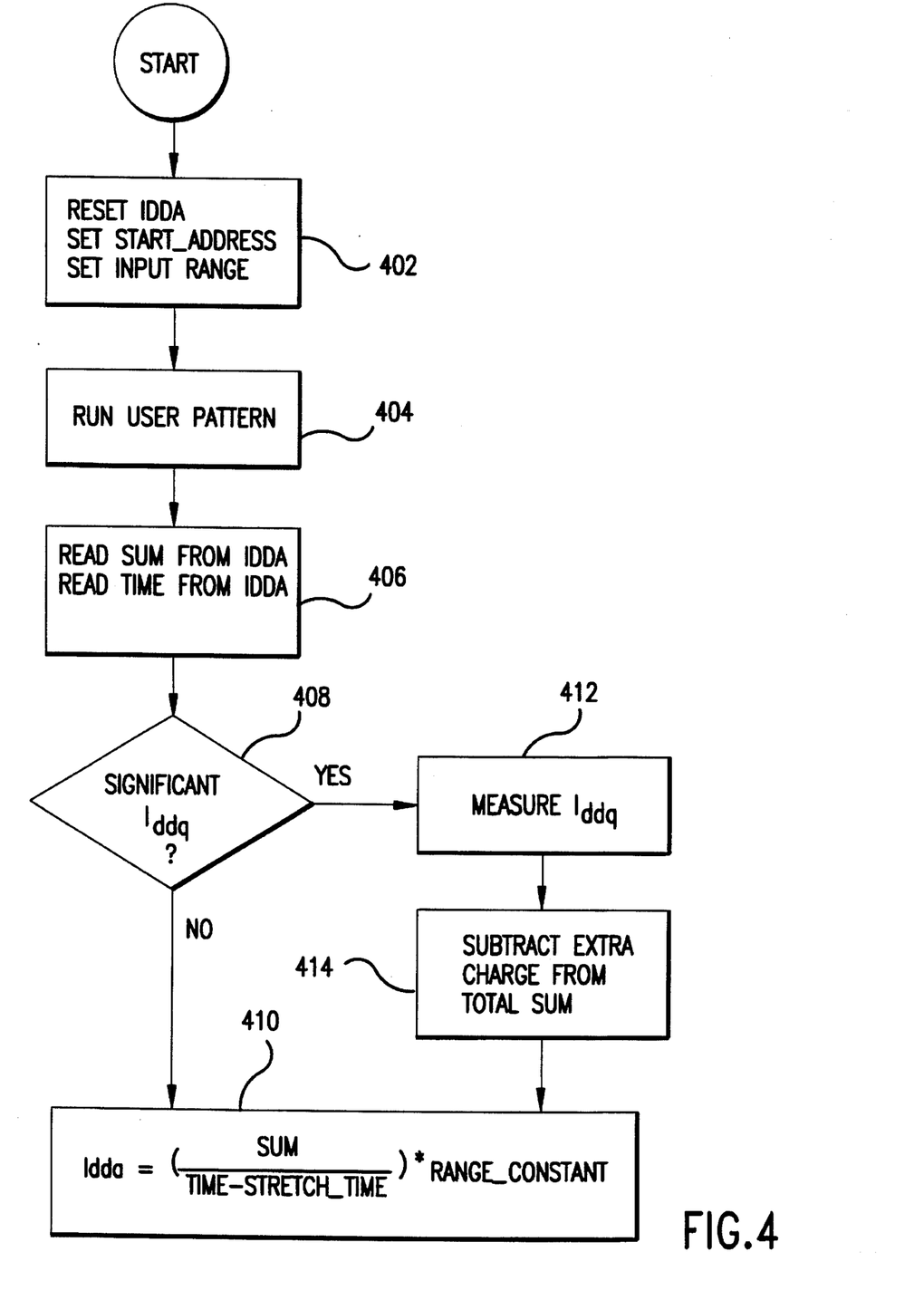
FIG. 4 is a graph showing current flow into a DUT which is useful for understanding the invention.

FIG. 4 shows a flow chart of the operation of a program on work station 102 (FIG. 1). The program begins at step 402, which is an initialization step. Accumulator 212 and timer 230 are reset to zero. Control values are loaded into registers 214, 218 and 222 and to timer 219. Also, flip-flop 226 and stretch pulse circuit 228 are reset. Other initialization functions are performed. For example, the gain of amplifier 208 might be adjustable under program control to alter the input range of analog to digital converter 210.

Execution proceeds to step 404 where a user specified pattern is executed. This pattern need not be written specifically to measure the average $I_{dd}$. It may measure or test features of DUT 104 other than the average $I_{dd}$.

At the end of the pattern, execution of the program proceeds to step 406. When the output of stretch pulse circuit 228 indicates that the measurement is completed, the contents of accumulator 212 and counter 230 are read over system bus 106 (FIG. 2).

At step 408, a decision is made based on the magnitude of $I_{ddq}$. If $I_{ddq}$ is small, it can be assumed that block 306 is also small and can be ignored. In this case, execution proceeds to block 410. The choice made at decision block 408 is programmed in advance by a human user based on knowledge of the part being tested.

Conversely, if $I_{ddq}$ is significant, the value of $I_{ddq}$ is measured at step 412. $I_{ddq}$ is a static value and can be simply measured by any known method employed in testers. The measured value of $I_{ddq}$, multiplied by the length of the stretch time, is subtracted from the value read from accumulator 212. The stretch time is determined by reading the value in counter 219 over system bus 106. Thereafter, program execution proceeds to step 410.

At step 410, the average value of $I_{dd}$ is computed. The average value is the sum of all current measurements taken divided by the length of test pattern after the start address was reached. That is, the value of accumulator 212 divided by the value of timer 230 less the stretch time read back from counter 219.

It may be necessary to scale this value by a range constant. The values out of analog to digital converter 210 are digital values proportional to the current flow. The proportionality constant depends on the size of resistor 202, the gain of amplifiers 204 and 208 as well as the gain of analog to digital converter 210. As is conventional, the range constant is selected based on these values.

The resulting computed value is reported to the user or otherwise used or displayed.

In the foregoing description, specific part numbers were not listed. Any number of components could be selected to perform the desired functions. Selection of specific components to perform the functions in FIG. 2 is within the skill of the art. In a preferred embodiment, though, the individual digital circuit elements shown in FIG. 2 are implemented as part of a ASIC chip.

Also, specific power, ground and timing connections are not shown. It will be appreciated that such connections are well understood and need not be explicitly shown.

Having described one embodiment of the invention, it will be apparent to one of skill in the art that various alternative embodiments could be formed. For example, FIG. 3 shows that T5 is programmed to occur when trace 304 returns to its quiescent value. No such limitation need be imposed. Also, it is shown that timer 230 runs until the end of the stretch interval. If counter 219 is used to extend measurements beyond the end of a test pattern by an amount equal to the lag between trace 302 and trace 304, timer 230 could be stopped at the end of the pattern. Alternatively, the value read from timer 230 could be decreased by the value loaded into counter 219. As another alternative, current measurements could be delayed following ignored initialization cycles at time T2 by an amount equal to the stretch time added at the end of the pattern. Further, the beginning of the measurements was described above to begin at time T2 regardless of the measured current level. Measurements could begin when the measured current exceeds a threshold As an example of another variation, it is not necessary that average $I_{dd}$ measurement circuit sense current flowing to DUT 104 through a sense resistor. Magnetic current sensors might be used. Also, it should be noted that accumulator 212 in conjunction with analog to digital converter 210 implement a digital integrator. An analog integrator could be used in their place.

Also, it was described that counter 230 continues to count for the whole time a measurement is being made but that the stretch time is later subtracted from that count. Counter 230 could also be made to stop counting at the end of the pattern so that there would be no need to subtract the stretch time from its count.

Further, it was described that the max_count variable and the stretch time variables were selected by the user. Either or both of these values might be fixed in advance.

Also, it was described in FIG. 2 that current measurements were integrated in a hardware accumulator. The integrator could be implemented in software. To do this, measurements could be stored in a RAM in the tester. Computer work station 102 could then total the values stored in memory.

Also, it was described that the accumulation began at some predetermined time after the start of a pattern. It will be observed that the predetermined time could be zero such that the accumulation would begin when the pattern begins.

Therefore, the invention should be limited only by the spirit and scope of the appended claims.

What is claimed is:

1. A tester adapted for measuring the average current consumed by a device under test comprising:
   a) at least one power source adapted for supplying power to the device under test;
   b) a pattern generator having an output indicating when a pattern is completed; and
   c) a circuit coupled to the device under test, said circuit comprising:
      i) an integrator having an input coupled to the power source and an enable input;
      ii) a first timer having an enable input; and
      iii) a control circuit having at least one control output, with a control output connected to the enable input of the integrator and a control output connected to the enable input of the timer, and a control input connected to said output of the pattern generator, said control circuit including means for asserting at least one control output at a predetermined time in relation to the start of a pattern and for deasserting at least one control output after the end of a pattern, wherein the control circuit comprises a second timer having an enable input coupled to the output of the pattern generator indicating when a pattern is completed.

2. The tester of claim 1 additionally comprising means for computing the quotient of the value stored in the integrator and the value stored in the timer.

3. The tester of claim 2 additionally comprising means for computing the quotient of the value stored in the integrator and the value stored in the timer reduced by the value stored in the second timer.

4. The tester of claim 1 wherein the tester comprises a tester body and an interface portion and the circuit coupled to the device under test is located in the tester body.

5. A tester adapted for measuring the average current consumed by a device under test comprising:
   a) at least one power source adapted for supplying power to the device under test;
   b) a pattern generator having an output indicating when a pattern is completed; and
   c) a circuit coupled to the device under test, said circuit comprising:
      i) an integrator having an input coupled to the power source and an enable input;
      ii) a timer having an enable input; and
      iii) a control circuit having at least one control output, with a control output connected to the enable input of the integrator and a control output connected to the enable input of the timer, and a control input connected to said output of the pattern generator, said control circuit including means for asserting at least one control output at a predetermined time in relation to the start of a pattern and for deassertinq at least one control output after the end of a pattern;
   d) a resistor in series between the power source and the device under test;
   e) an analog to digital converter having an input and an output, with the input coupled to the signal across the resistor and the output connected to the integrator.

6. The tester of claim 5 wherein:
   a) the pattern generator has an output indicating the cycle of the test pattern being executed; and
   b) the means for asserting at least one output at a predetermined time in relation to the start of the pattern comprises:
      i) a cycle register;
      ii) a comparator producing an asserted logic signal when the output of the pattern generator indicating the test pattern being executed equals the value in the cycle register.

7. The tester of claim 6 wherein the at least one control output connected to the enable input of the integrator and the at least one control output connected to the timer are the same control output.

8. The tester of claim 6 wherein the means for deasserting at least one control output after the end of a pattern comprises:
   a) a level register;
   b) a second comparator having a first input connected to the output of the analog to digital converter and a second input connected to the level register; and
   c) means for deasserting the at least one control output in response to the output of the comparator.

9. The tester of claim 8 additionally comprising a control register and the means for deasserting the at least one control output comprises means for deasserting the at least one control output in response to the output of the second comparator when the control register has a predetermined value.

10. The tester of claim 9 wherein the means for deasserting the at least one control output comprises a counter having a start count input connected to the output of the pattern generator indicating when a pattern is completed and an output indicating when a predetermined number of counts have occurred.

11. The tester of claim 10 additionally comprising:
    a) a computer work station; and
    b) a bus connecting the computer work station to the control circuit.

12. The tester of claim 11 including means for computing the average current drawn by the device under test during the execution of a pattern from the values stored in the integrator and the timer, said means for computing being the computer work station.

13. The tester of claim 12 wherein the means for computing the average current drawn by the device under test includes means for computing the average current from the values stored in the integrator, the timer and the counter.

14. The tester of claim 5 wherein the means for deasserting the at least one control output comprises a counter having a start count input connected to the output of the pattern generator indicating when a pattern is completed and an output indicating when a predetermined number of counts have occurred.

15. A method of operating a tester to compute the average current drawn by a device under test where the instantaneous current drawn by the device under test is different than the current supplied by a power supply, comprising the steps of:
    a) resetting an integrator and a timer;
    b) executing a test pattern;
    c) starting the timer a predetermined amount of time after the start of the pattern;
    d) integrating the instantaneous current flowing out of a power supply from the first time after the start of a pattern to a second time after the end of the pattern;
    e) computing the quotient of the integrated current and the length of time between the first time after the start of the pattern and the end of the pattern f) measuring the quiescent current drawn by the device under test;

g) computing the product of the quiescent current and the time between the end of the pattern and the second time after the end of the pattern; and h) subtracting the product from the integrated instantaneous current prior to the step of computing the quotient.

16. The method of claim 15 wherein the second time after the end of the pattern is determined when the current flowing out of the power supply falls below a predetermined level.

17. The method of claim 15 wherein the second time after the end of the pattern is a predetermined amount of time.

18. The method of claim 15 wherein the second time after the end of the pattern is selected from a group of times consisting of the time when the current flowing out of the power supply falls below a predetermined level and a predetermined amount of time after the end of the pattern.

19. The method of claim 15 wherein the step of executing a pattern comprises executing a pattern testing operating characteristics of the device under test other than average current.

20. The method of claim 15 wherein the pattern is executed at a first rate and the integration is performed by periodically adding measured values to an accumulator at a second rate which is slower than the first rate.

21. A tester adapted for testing a device under test comprising:

a) a voltage source having an output adapted to be connected to the device under test;

b) a analog to digital converter having an input coupled to the output of the voltage source and a digital output representing the instantaneous value of the current supplied by the voltage source;

c) an accumulator having an input coupled to the output of the analog to digital converter and a control input controlling when values are added to the value stored in the accumulator;

d) means for executing a test pattern having an output indicating when the end of a pattern has been executed and a second output indicating which vector in the pattern is being executed;

e) a counter having a control input controlling when the counter counts;

f) a second counter having a control input controlling when the counter counts and an output indicating when the counter is counting, said input being coupled to the output of the means for executing a test pattern;

g) logic circuit means, having an input coupled to the second output of the means for executing a test pattern, for producing an output indicating when the means for executing a test pattern has executed a predetermined vector; and h) means for computing the logical OR of the output of the logic circuit means and the output of the counter, said means having an output connected to the control input of the accumulator and the control input of the counter.

22. The tester of claim 21 additionally comprising means for computing the quotient of the value stored in the accumulator and the value stored in the first counter reduced by the value stored in the second counter.

23. The tester of claim 22 wherein the second counter has a second control input which stops the counter from counting, said tester additionally comprising:

a) means, coupled to the output of the analog to digital converter, for indicating when the output of the analog to digital converter is below a predetermined value;

b) logic circuitry means for computing the logical AND of at least the output of the means for indicating and the output of the means for executing a pattern, said logic circuitry means being coupled to the second control input of the second counter.

* * * * *